(12) United States Patent
Doumae et al.

(10) Patent No.: US 7,791,922 B2
(45) Date of Patent: Sep. 7, 2010

(54) SEMICONDUCTOR MEMORY DEVICE

(75) Inventors: Sumiko Doumae, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 12/186,088

(22) Filed: Aug. 5, 2008

(65) Prior Publication Data
US 2009/0040807 A1  Feb. 12, 2009

(30) Foreign Application Priority Data
Aug. 6, 2007 (JP) .............................. 2007-204586

(51) Int. Cl.
*G11C 11/00* (2006.01)
(52) U.S. Cl. ...................... 365/145; 365/200
(58) Field of Classification Search .................. 365/145, 365/200
See application file for complete search history.

(56) References Cited

U.S. PATENT DOCUMENTS

| | | | | |
|---|---|---|---|---|
| 6,768,151 B2 * | 7/2004 | Kasai | .......................... | 257/295 |
| 6,795,331 B2 * | 9/2004 | Noro | .......................... | 365/145 |
| 6,809,949 B2 * | 10/2004 | Ho | .............................. | 365/145 |
| 6,838,718 B2 * | 1/2005 | Nakamura | ................... | 257/295 |
| 2008/0084730 A1 | 4/2008 | Hoya et al. | | |

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A semiconductor memory device includes a memory cell array of memory cells each including a cell transistor and a ferroelectric capacitor; a sense amp circuit operative to sense/amplify a signal read out of the ferroelectric capacitor through a pair of bit lines; a pair of decoupling transistors provided on the pair of bit lines to decouple the bit lines; a control circuit operative to provide a control signal to the gates of the decoupling transistors to control conduction of the decoupling transistors; and a dummy capacitor provided in connection with at least either one of the pair of bit lines between the decoupling transistors and the sense amp circuit. The control circuit is configured to be capable of turning the decoupling transistors from on to off when a certain period of time elapsed after the beginning of reading.

11 Claims, 7 Drawing Sheets

SEMICONDUCTOR MEMORY DEVICE

CROSS-REFERENCE TO RELATED APPLICATION

This application is based upon and claims the benefit of priority from the prior Japanese Patent Application No. 2007-204586, filed on Aug. 6, 2007, the entire contents of which are incorporated herein by reference.

BACKGROUND OF THE INVENTION

1. Field of the Invention

The present invention relates to a semiconductor memory device, and more particularly to a semiconductor memory device using ferroelectric capacitors.

2. Description of the Related Art

A memory device that uses a ferroelectric capacitor as a storage medium, (ferroelectric memory), has been developed and actually used (see, for example, JP 2001-250376A). Ferroelectric memory cells may occasionally vary the signal quantity from the initial state due to thermal stresses and so forth. The ferroelectric memory cells may include such cells that deteriorate earlier even if the initial characteristic is excellent, and such cells that deteriorate after a certain time even if the signal quantity characteristic once becomes better due to thermal stresses and so forth. Therefore, a grasp of the behaviors of different ferroelectric memory cells requires a grasp of accurate cell signal quantities. Thus, an execution of a test mode to grasp the characteristics of the ferroelectric memory cells becomes inevitable.

The signal quantities in cells have been measured in the test mode through a method of directly applying a voltage from external to bit lines to charge all bit lines before measuring, and a method of using dummy cells for the reference potential. The method of directly applying a voltage from external to bit lines to charge bit lines has an advantage because there is no restriction on the level of the reference potential. It requires a time for charging a reference bit line to a desired voltage, however, and accordingly it requires a test time longer by that time. Therefore, it is not suitable for mass-storage ferroelectric memories because of the problem on the test time.

The method of using dummy cells for the reference potential is suitable for mass storage ferroelectric memories because the dummy cells are also available in normal operation and no special configuration for test is required. A configuration of a semiconductor memory device using dummy cells of prior art is described herein. The semiconductor memory device using dummy cells of prior art comprises a pair of bit lines connected to ferroelectric memory cells at one end, dummy capacitors connected at one end to the pair of bit lines, and dummy plate lines connected at one end to the dummy capacitor at the other end. The semiconductor memory device using prior art dummy cells boosts the potential on the reference-side dummy plate line, then compares the potentials on the pair of bit lines, and determines the output signal at "High" or "Low".

In such a semiconductor memory device using prior art dummy cells, a ferroelectric memory cell has a large capacity. Accordingly, a sufficiently large reference potential can not be achieved unless the dummy capacitor also has a large capacity. If there is a large difference between capacities of ferroelectric memory cells in connection with the pair of bit lines, the dummy capacitor is required to have a large capacity to eliminate the imbalance between the capacities.

Therefore, for such the reason, the dummy capacitor has a large capacity, which has the problem of increasing the area occupied by the dummy capacitor. In addition, if the power supply for providing the reference potential has a restriction on the ability to supply the potential, it is difficult to greatly fluctuate the reference potential to be compared with the read potential as a problem.

SUMMARY OF THE INVENTION

In an aspect the present invention, there is provided a semiconductor memory device, comprising: a memory cell array of memory cells each including a cell transistor and a ferroelectric capacitor; a sense amp circuit operative to sense/amplify a signal read out of the ferroelectric capacitor through a pair of bit lines; a pair of decoupling transistors provided on the pair of bit lines to decouple the bit lines; a control circuit operative to provide a control signal to the gates of the decoupling transistors to control conduction of the decoupling transistors; and a dummy capacitor provided in connection with at least either one of the pair of bit lines between the decoupling transistors and the sense amp circuit, wherein the control circuit is configured to be capable of turning the decoupling transistors from on to off when a certain period of time elapsed after the beginning of reading.

DETAILED DESCRIPTION OF THE EMBODIMENTS

The embodiments of the present invention will now be described with reference to the drawings.

First Embodiment (Configuration of Semiconductor Memory Device of First Embodiment)

Figure 1:
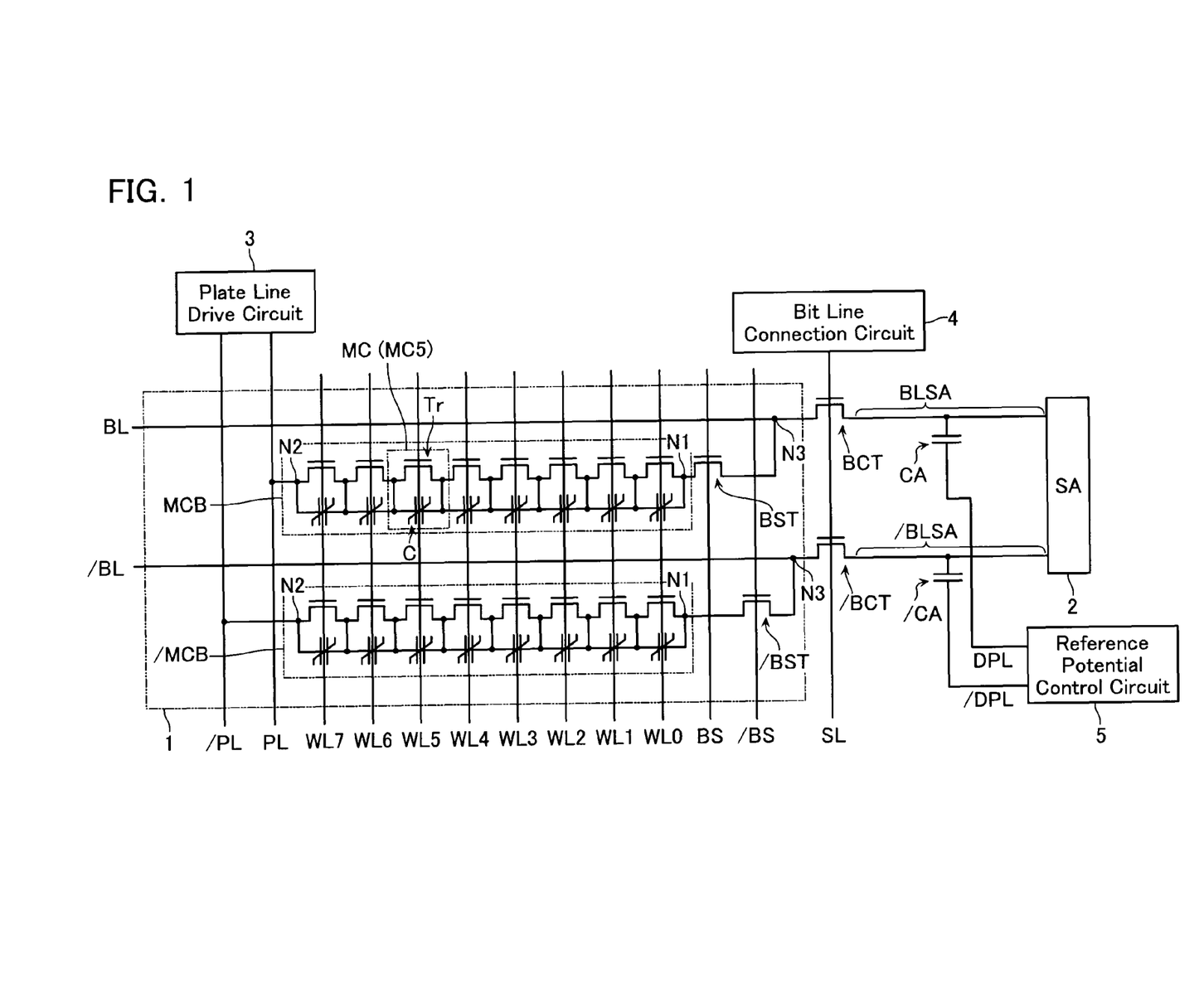
FIG. 1 shows a semiconductor memory device according to a first embodiment of the present invention.

FIG. 1 is a block diagram of a semiconductor memory device (FeRAM) according to a first embodiment of the present invention. The semiconductor memory device according to the first embodiment comprises a memory cell array 1, a sense amp circuit 2, a plate line drive circuit 3, a bit line connection circuit 4, and a reference potential control circuit 5. The sense amp circuit 2, the plate line drive circuit 3, the bit line connection circuit 4 and the reference potential control circuit 5 have functions of controlling the potentials on signal lines connected to the memory cell array 1 at "High" and "Low".

The memory cell array 1 comprises a memory cell MC including a ferroelectric capacitor C and a transistor Tr. In the memory cell MC the ferroelectric capacitor C and the transistor Tr are connected in parallel. In the shown example, such eight memory cells MC are connected in series to configure a cell block MCB. Namely, each cell block MCB configures a TC parallel unit serial connection type ferroelectric memory. In the figure, the memory cell array 1 includes a pair of bit lines BL, /BL and shows cell blocks MCB, /MCB connected to the bit lines BL, /BL. The pair of bit lines BL, /BL are connected at one end to the sense amp circuit 2.

The cell block MCB has one end, which is a node N1 connected via block selection transistors BST, /BST to the bit line BL at a node N3, and the other end, which is a node N2 connected to plate lines PL, /PL. The plate lines PL, /PL are connected to the plate line drive circuit 3.

In connection with the bit line BL between the node N3 and the sense amp circuit 2, a bit line connection transistor BCT (decoupling transistor) is provided. Similarly, in connection with the bit line /BL, a bit line connection transistor /BCT (decoupling transistor) is provided apart an almost equidistance from the sense amp circuit 2 as the bit line connection transistor BCT. The bit line connection transistors BCT, /BCT have respective gates, which are connected to a bit line connection line SL. The bit line connection line SL is connected to the bit line connection circuit 4. The bit line connection circuit 4 brings the bit line connection transistors BCT, /BCT into conduction and out of conduction via the bit line connection line SL.

Dummy capacitors CA, /CA are connected at one end to portions between the bit line connection transistors BCT, /BCT and the sense amp circuit 2. The dummy capacitors CA, /CA are connected at the other end to the reference potential control circuit 5 via dummy plate lines DPL, /DPL. The reference potential control circuit 5 provides potentials to the dummy capacitors CA, /CA via the dummy plate lines DPL, /DPL.

(Operation of Semiconductor Memory Device of First Embodiment)

Figure 2:
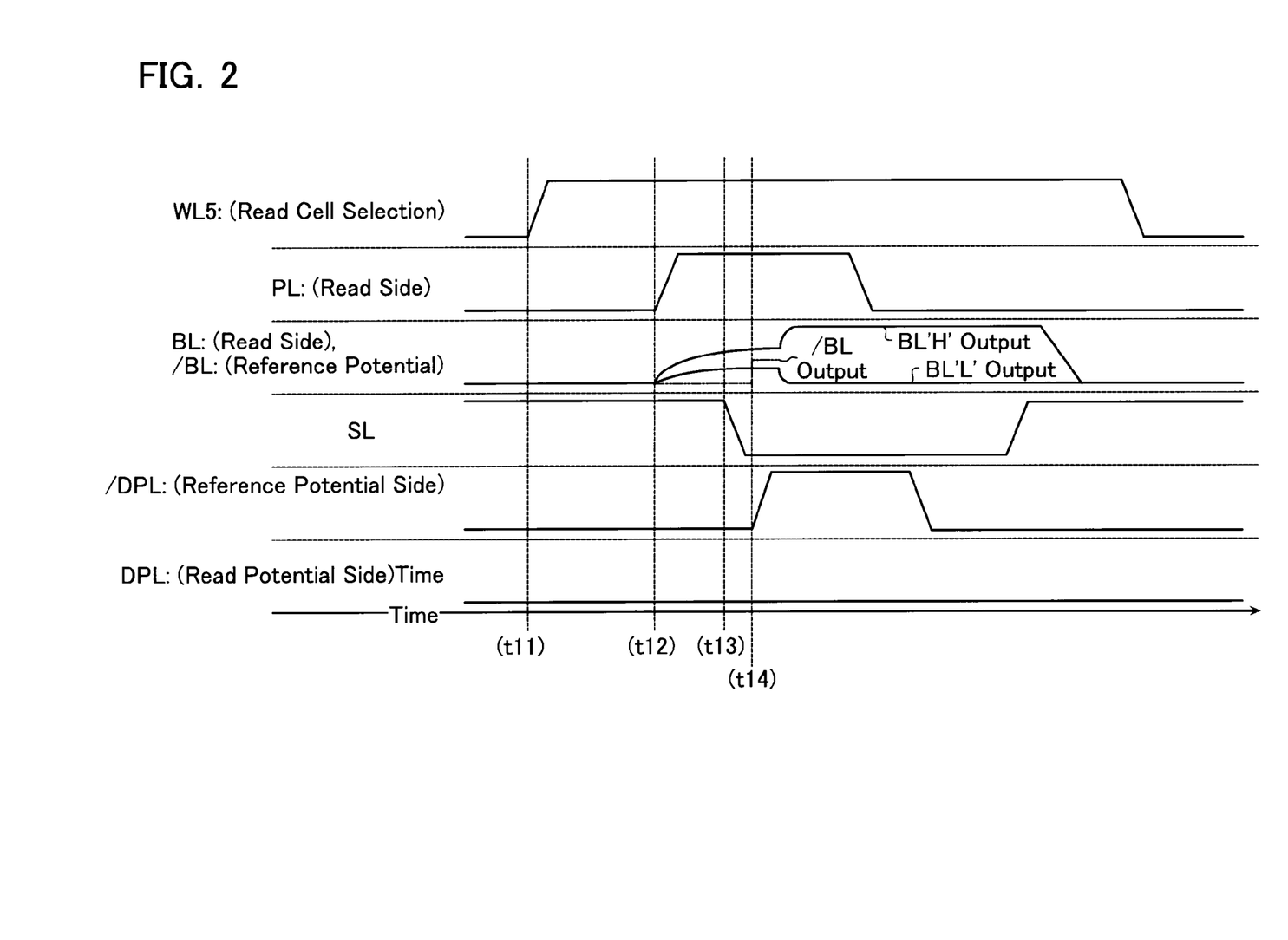
FIG. 2 is an operating waveform diagram on reading the potential on a memory cell MC5 in the semiconductor memory device according to the first embodiment of the present invention.

With reference to FIGS. 1 and 2, the following description is given to reading a signal potential on a memory cell MC5 in the semiconductor memory device according to the first embodiment. FIG. 2 is an operating waveform diagram on reading from a memory cell in the semiconductor memory device according to the first embodiment. FIG. 2 shows the potentials on the word line WL5, the plate line PL, the bit lines BL, /BL, the bit line connection line SL, and the dummy plate lines DPL, /DPL.

The bit lines BL, BBL for use in the following description includes portions of which names are herein defined. Namely, a portion of the bit line BL from the bit line connection transistor BCT to the sense amp circuit 2 is defined as a partial bit line BLSA. A portion of the bit line /BL from the bit line connection transistor /BCT to the sense amp circuit 2 is defined as a partial bit line /BLSA.

As shown in FIG. 2, in the state before the beginning of reading, only the potential on the bit line connection line SL is kept at "High" and the potentials on the other signal lines (WL5, PL, BL, /BL, /DPL, DPL) are controlled "Low". In a word, the bit line connection transistors BCT, /BCT are kept "ON".

First, in reading the signal potential on the memory cell MC5, the signal on the word line WL5 is boosted to "High" (time t11). Then, the plate line drive circuit 3 boosts the potential on the plate line PL connected to the word line WL5 up to "High" (time t12). As a result, the bit line BL moves to a potential corresponding to the data retained in the memory cell MC5. Also at time t12, the reference potential control circuit 5 holds the potential on the dummy plate line /DPL at "Low".

Subsequently, the bit line connection circuit 4 changes the potential on the bit line connection line SL to "Low" (time t13) to turn "OFF" the bit line connection transistors BCT, /BCT. Next, the reference potential control circuit 5 boosts the potential on the dummy plate line /DPL up to "High" (time t14).

The operation of the reference potential control circuit 5 at time t14 sets a reference potential on the partial bit line /BLSA. The sense amp circuit 2 compares the reference potential with the read potential caused on the partial bit line BLSA and generates and provides an output signal of "High" or "Low".

As described above, in the semiconductor memory device according to the first embodiment, the bit line connection transistors BCT, /BCT can be brought out of conduction (turned "OFF"). In this case, the partial bit lines BLSA, /BLSA shorter in wiring length than the bit lines BL, /BL can be connected to the sense amp circuit 2. Therefore, the sense amp circuit 2 is cut from the capacities of the memory cells MC and connected only to the smaller-capacity partial bit lines BLSA, /BLSA. In a word, the capacities of the dummy capacitors CA, /CA may be designed smaller than the dummy capacitors contained in the semiconductor memory device of prior art, thereby making the area occupied by the dummy capacitors CA, /CA smaller than the conventional art.

Second Embodiment (Configuration of Semiconductor Memory Device of Second Embodiment)

Figure 3:
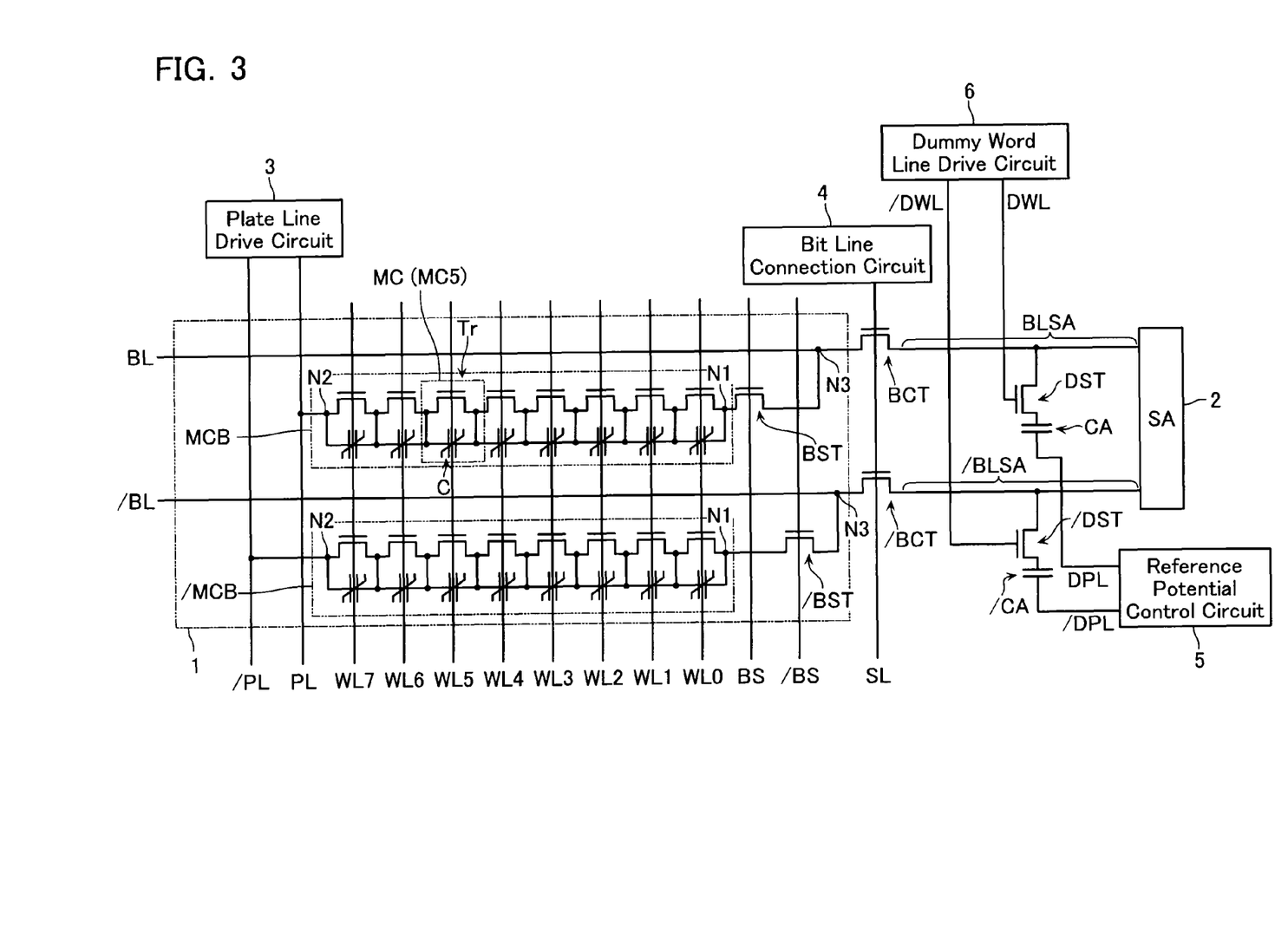
FIG. 3 shows a semiconductor memory device according to a second embodiment of the present invention.

Referring next to FIG. 3, a semiconductor memory device according to a second embodiment of the present invention is described. FIG. 3 is a block diagram of the semiconductor memory device (FeRAM) according to the second embodiment of the present invention. In the second embodiment the same elements as those in the first embodiment are denoted with the same reference numerals and omitted from the following description.

The above-described semiconductor memory device according to the first embodiment reduces the area occupied by the dummy capacitors CA, /CA. On the other hand, the capacities of the bit lines BL, /BL are small (because they are only the partial bit lines BLSA, /BLSA) and accordingly α rays may cause failed program possibly. The semiconductor memory device according to the second embodiment eliminates such the problem about the first embodiment.

The semiconductor memory device according to the second embodiment comprises a dummy word line drive circuit 6 in addition to the configuration in the first embodiment.

Further formed between the dummy capacitors CA, /CA and the bit lines BL, /BL are dummy capacitor selection transistors DST, /DST. These dummy capacitor selection transistors DST, /DST have respective gates, which are connected via dummy word lines DWL, /DWL to the dummy word line drive circuit 6. The dummy word line drive circuit 6 controls the signal potentials on the dummy word lines DWL, /DWL at "High" and "Low". In a word, the dummy word line drive circuit 6 brings the dummy capacitor selection transistors DST, /DST into conduction or out of conduction via the dummy word lines DWL, /DWL.

(Operation of Semiconductor Memory Device of Second Embodiment)

Figure 4:
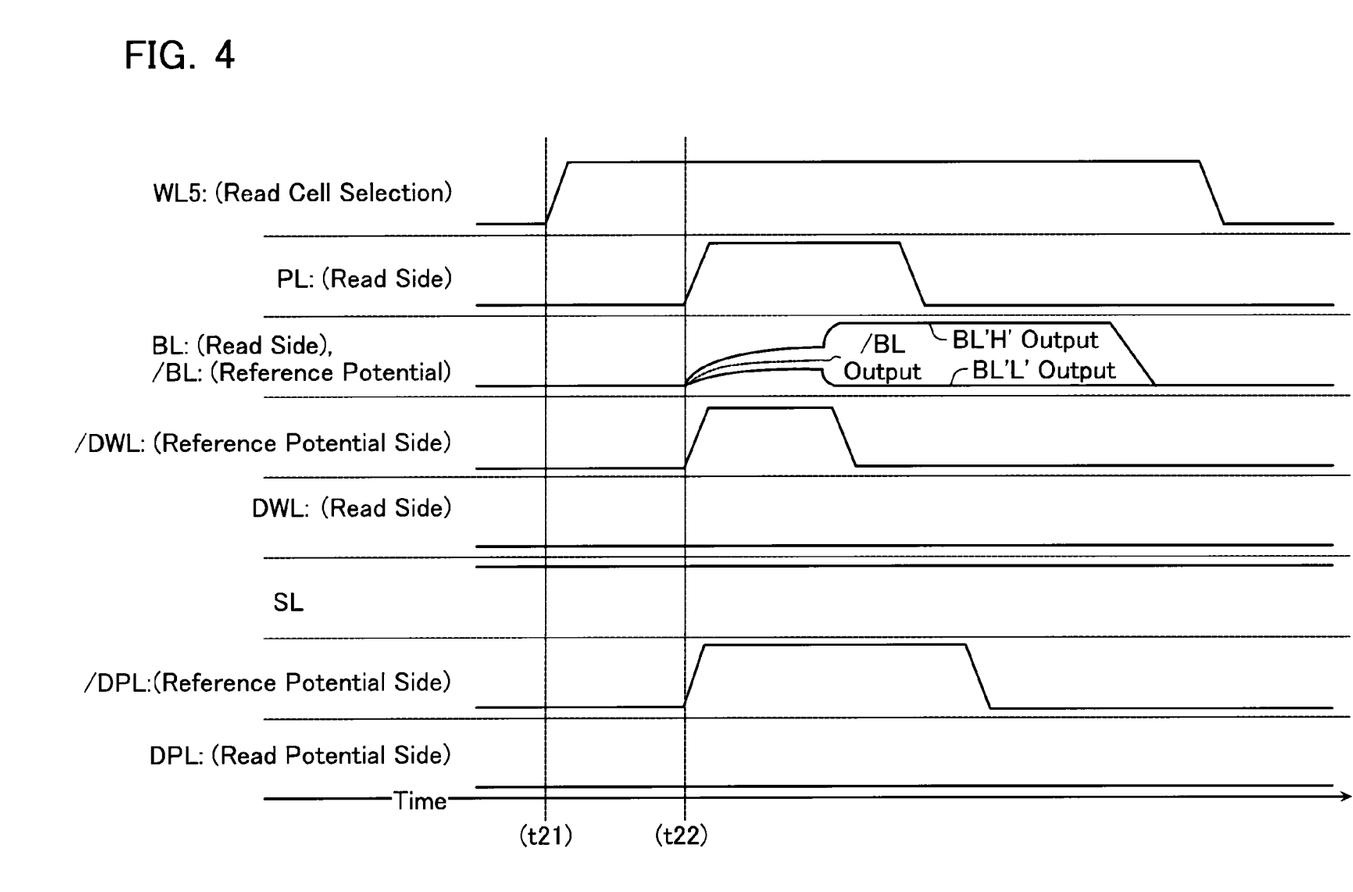
FIG. 4 is an operating waveform diagram in a normal mode on reading the potential on the memory cell MC5 in the semiconductor memory device according to the second embodiment of the present invention.
Figure 5:
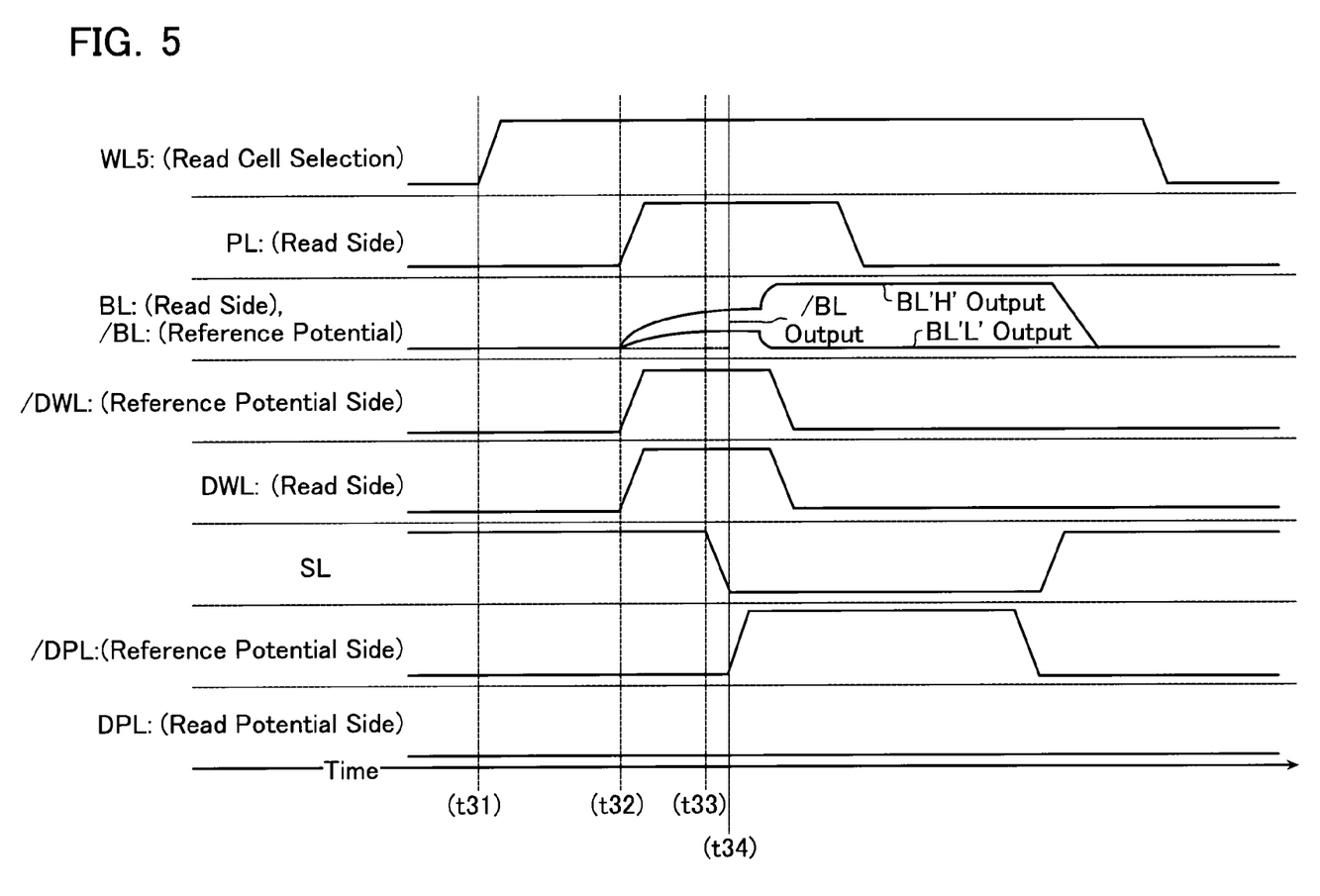
FIG. 5 is an operating waveform diagram in a test mode on reading the potential on the memory cell MC5 in the semiconductor memory device according to the second embodiment of the present invention.

With reference to FIGS. 3-5, the following description is given to reading a signal potential on the memory cell MC5 in the semiconductor memory device according to the second embodiment. Reading the signal potential on the memory cell MC5 in the semiconductor memory device according to the second embodiment has two modes. The first mode is a normal mode in which the reference potential can be fluctuated within a small range. The second mode is a test mode in which the reference potential can be fluctuated within a large range. FIG. 4 is an operating waveform diagram in the normal mode on reading from the memory cell MC5 in the semiconductor memory device according to the second embodiment. FIG. 5 is an operating waveform diagram in the test mode on reading from the memory cell MC5 in the semiconductor memory device according to the second embodiment.

Referring to FIGS. 3 and 4, the normal mode reading is described first. In the normal mode reading, the bit line connection circuit 4 keeps the signal potential on the bit line connection line SL at "High" during the operation. In a word, the bit line connection transistors BCT, /BCT are kept "ON". Although not shown, the block selection transistors BST, /BST are kept "ON".

First, at time t21, the signal potential on the word line WL5 is boosted up to "High". Subsequently, at time t22, the plate line drive circuit 3 boosts the potential on the plate line PL to "High". Similarly, at time t22, the dummy word line drive circuit 6 boosts the potential on the dummy word line /DWL to "High", and the reference potential control circuit 5 boosts the potential on the dummy plate line /DPL up to "High". The sense amp circuit 2 compares the reference potential with the read potential caused on the partial bit line BLSA and generates and provides an output signal of "High" or "Low".

Referring to FIGS. 3 and 5, the test mode reading is described next. As shown in FIG. 5, in the state before the beginning of reading, only the potential on the bit line connection line SL is kept at "High" and the potentials on the other signal lines (WL5, PL, BL, /BL, /DPL, DPL) are controlled "Low". In a word, the bit line connection transistors BCT, /BCT are kept "ON".

First, in reading the signal potential on the memory cell MC5, the signal on the word line WL5 is boosted to "High" (time t31). Then, the plate line drive circuit 3 boosts the potential on the plate line PL connected to the word line WL5 up to "High" (time t32). Simultaneously, at time t32, the dummy word line drive circuit 6 boosts the potentials on the dummy word lines DWL, /DWL up to "High". These operations at time t32 cause a potential corresponding to the data retained in the memory cell MC5 on the bit line BL. Also at time t32, the reference potential control circuit 5 holds the potential on the dummy plate line /DPL at "Low". Through the above operations, the signal potential on the memory cell MC5 can be read out.

Subsequently, the bit line connection circuit 4 changes the potential on the bit line connection line SL to "Low" (time t33) to turn "OFF" the bit line connection transistors BCT, /BCT. Next, the reference potential control circuit 5 boosts the potential on the dummy plate line /DPL up to "High" (time t34).

The operation of the reference potential control circuit 5 at time t34 sets a reference potential based on the partial bit line /BLSA. The sense amp circuit 2 compares the reference potential with the read potential generated on the partial bit line BLSA and generates and provides an output signal of "High" or "Low".

Figure 6:
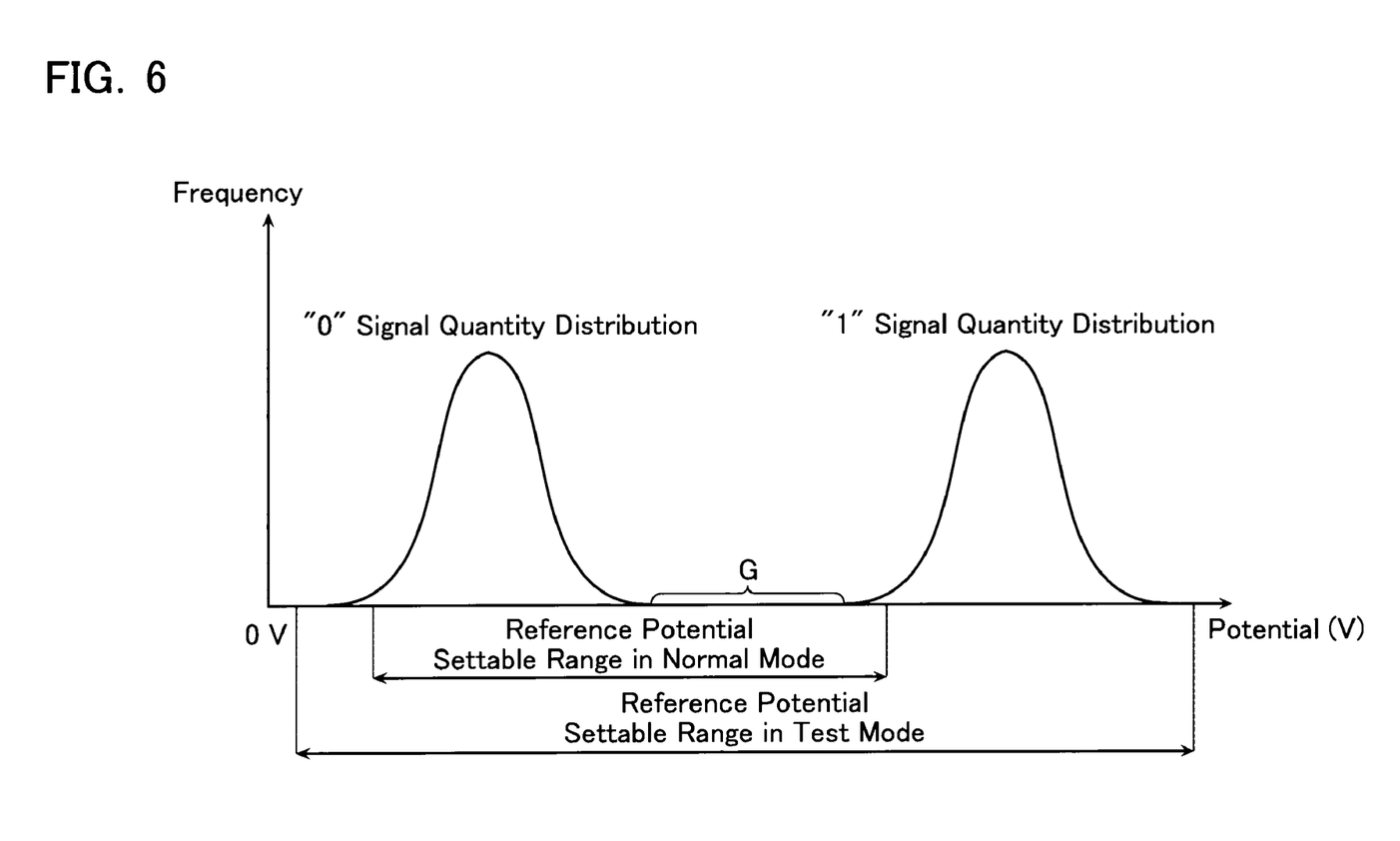
FIG. 6 shows a "0" signal quantity distribution and a "1" signal quantity distribution and reference potential settable ranges in the normal and test modes in the semiconductor memory device according to the first embodiment of the present invention.

It is assumed herein that a "0" signal quantity distribution and a "1" signal quantity distribution are present on the opposite sides of a gap G of a certain potential difference in the semiconductor memory device according to the second embodiment as shown in FIG. 6. In this case, desirably, the reference potential for deciding whether the read potential is "Low" or "High" locates in the gap G. If the "0" signal quantity distribution and the "1" signal quantity distribution are unknown, it is required to vary the reference potential from the low potential side of the "0" signal quantity distribution to the high potential side of the "1" signal quantity distribution to measure the "0" signal quantity distribution and the "1" signal quantity distribution based on the output from the sense amp circuit 2.

In the second embodiment, reading is executed also in the test mode. In the test mode reading, the partial bit lines BLSA, /BLSA electrically disconnected from the mass storage memory cells MC allow the reference potential to fluctuate over a wide range from a lower potential than the "0" signal quantity distribution to a higher potential than the "1" signal quantity distribution (see FIG. 6). In a word, in the second embodiment of the present invention, the test mode reading fluctuates the reference potential wider to measure the "0" signal quantity distribution and the "1" signal quantity distribution. In this regard, the second embodiment is similar to the first embodiment.

Further, in the second embodiment, the partial bit lines BLSA, /BLSA are not disconnected in the normal mode reading. In this case, the reference potential settable range is made smaller than that in the test mode as shown in FIG. 6 (such as a potential range from the skirt on the low energy side of the "0" signal quantity distribution to the skirt on the low energy side of the "1" signal quantity distribution). The bit lines BL, /BL are not disconnected from the partial bit lines BLSA, /BLSA and have large parasitic capacities. Accordingly, it is possible to prevent failed program caused by α rays from occurring.

Therefore, in the second embodiment, after determination of the reference potential in the test mode, signal reading in the normal mode can be executed while suppressing failed program caused by α rays.

With the above configuration, the semiconductor memory device according to the second embodiment can exert the same effect as in the first embodiment. The dummy capacitor selection transistors DST, /DST enable the dummy capacitors CA, /CA to be selectively connected to or disconnected from the bit lines BL, /BL. Accordingly, in accordance with the parasitic capacities on the bit lines BL, /BL in the normal mode, it is possible to eliminate the imbalance between the capacities better than the first embodiment.

Third Embodiment (Configuration of Semiconductor Memory Device of Third Embodiment)

Figure 7:
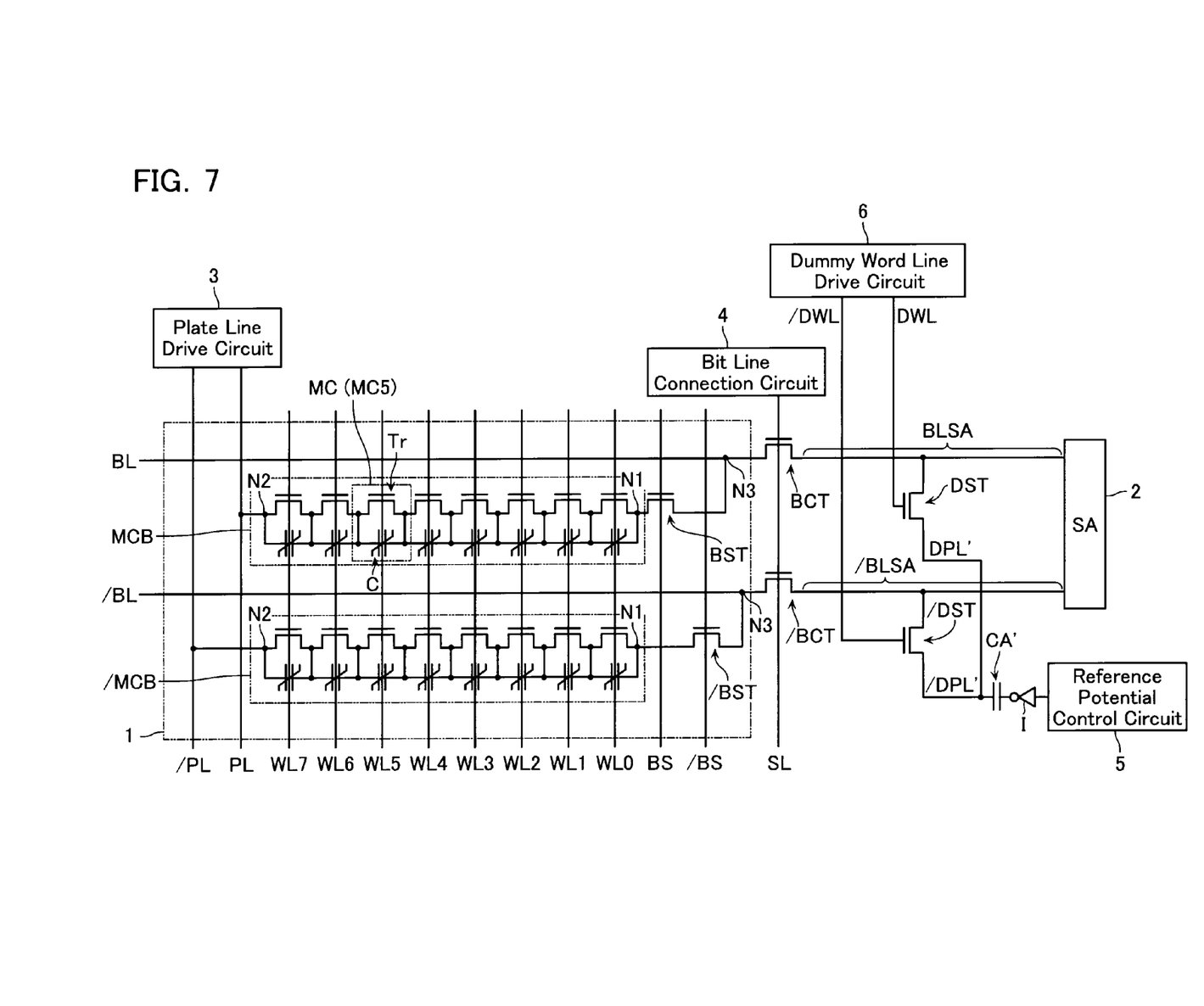
FIG. 7 shows a semiconductor memory device according to a third embodiment of the present invention.

Referring next to FIG. 7, a semiconductor memory device according to a third embodiment of the present invention is described. FIG. 7 is a block diagram of the semiconductor memory device (FeRAM) according to the third embodiment of the present invention. In the third embodiment the same elements as those in the second embodiment are denoted with the same reference numerals and omitted from the following description.

In the semiconductor memory device according to the third embodiment, the reference potential control circuit 5 is connected to one end of the dummy capacitor CA' via an inverter I. The inverter I is provided in connection with one end of the dummy capacitor CA' on the side not connected to the bit lines BL, /BL.

The other end of the dummy capacitor CA' is connected to the dummy plate lines DPL, /DPL. The dummy plate lines DPL, /DPL are connected to the bit lines BL, /BL via the dummy capacitor selection transistors DST, /DST. The gates of the dummy capacitor selection transistors DST, /DST are connected to the dummy word line drive circuit 6 via the dummy word lines DWL, /DWL like in the second embodiment.

The operation of the semiconductor memory device according to the third embodiment is similar to the second embodiment and accordingly omitted from the following description.

The semiconductor memory device according to the third embodiment thus configured can exert the same effect as in the first and second embodiments. It is structured with only a single dummy capacitor CA' and accordingly the area occupied by the entire semiconductor memory device (entire chip) can be designed narrower than the first and second embodiments. The semiconductor memory device according to the third embodiment can exert the effect if the imbalance between the capacities on the bit lines BL, /BL is small.

The first through third embodiments of the present invention have been described above though the invention is not limited to the above embodiments. For example, in the above embodiments, the bit line BL is used for the read potential and the bit line /BL for the reference potential in the described example though the bit line BL may be used for the reference potential and the bit line /BL for the read potential.

What is claimed is:

1. A semiconductor memory device, comprising:
   a memory cell array of memory cells each including a cell transistor and a ferroelectric capacitor;
   a sense amp circuit operative to sense/amplify a signal read out of said ferroelectric capacitor through a pair of bit lines;
   a pair of decoupling transistors provided on said pair of bit lines to decouple said bit lines;
   a control circuit operative to provide a control signal to the gates of said decoupling transistors to control conduction of said decoupling transistors; and
   a dummy capacitor provided in connection with at least either one of said pair of bit lines between said decoupling transistors and said sense amp circuit,
   wherein said control circuit is configured to be capable of turning said decoupling transistors from on to off when a certain period of time elapses after the beginning of reading.

2. The semiconductor memory device according to claim 1, further comprising a potential control circuit operative to control the potentials on said pair of bit lines between said decoupling transistors and said sense amp circuit via said dummy capacitor,
   wherein said potential control circuit is configured to charge one of said pair of bit lines after said decoupling transistors are turned from on to off.

3. The semiconductor memory device according to claim 1, wherein said control circuit is configured to be capable of keeping said decoupling transistors turned on during reading in a first mode while turning said decoupling transistors from on to off when a certain period of time elapses after the beginning of reading in a second mode.

4. The semiconductor memory device according to claim 3, further comprising a potential control circuit operative to control the potentials on said pair of bit lines via said dummy capacitor between said decoupling transistors and said sense amp circuit,
   wherein said potential control circuit is configured to charge one of said pair of bit lines after said decoupling transistors are turned from on to off in said second mode.

5. The semiconductor memory device according to claim 1, wherein said dummy capacitor is one of a pair of dummy capacitors provided in connection with said pair of bit lines.

6. The semiconductor memory device according to claim 1, wherein said dummy capacitor has one end connected to both of said pair of bit lines.

7. The semiconductor memory device according to claim 1, further comprising connection transistors provided between said dummy capacitor and said pair of bit lines and operative to switch between connection and disconnection between said pair of bit lines and said dummy capacitor.

8. The semiconductor memory device according to claim 7, further comprising a drive circuit operative to on/off-control said connection transistors,
   wherein said drive circuit turns said connection transistors from off to on before said decoupling transistors are turned from on to off.

9. The semiconductor memory device according to claim 1, further comprising an inverter provided in connection with one end of said dummy capacitor on the side not connected to said pair of bit lines.

10. The semiconductor memory device according to claim 1, wherein said memory cell array comprises a plurality of memory cells each including said cell transistor and said ferroelectric connected in parallel,
    wherein said plurality of memory cells are connected in series.

11. The semiconductor memory device according to claim 1, further comprising block selection transistors operative to control conduction between said memory cell array and said pair of bit lines.

* * * * *